United States Patent [19]
Ohigashi et al.

[11] 3,940,637
[45] Feb. 24, 1976

[54] POLYMERIC PIEZOELECTRIC KEY ACTUATED DEVICE

[75] Inventors: Hiroji Ohigashi, Kamakura; Reiko Shigenari, Fujisawa; Syozo Ogawa; Nobuo Sekine, both of Kamakura, all of Japan

[73] Assignee: Toray Industries, Inc., Tokyo, Japan

[22] Filed: Apr. 24, 1974

[21] Appl. No.: 463,787

[30] Foreign Application Priority Data
Oct. 15, 1973  Japan............................ 48-114708

[52] U.S. Cl. .................. 310/8.5; 310/8.3; 310/8.6; 310/9.1; 310/9.5; 340/265; 200/181
[51] Int. Cl.² .......................................... H01L 41/04
[58] Field of Search ............... 310/8, 8.3, 8.5–8.7, 310/9.1, 9.4, 9.5; 340/265 A; 200/181

[56] References Cited
UNITED STATES PATENTS

| | | |
|---|---|---|
| 3,365,593 | 1/1968 | Roof et al. ............................ 310/8.7 |
| 3,464,531 | 9/1969 | Herr et al. ............................ 310/8.3 |
| 3,648,279 | 3/1972 | Watson ............................ 310/8.3 X |
| 3,798,473 | 3/1974 | Murayama et al. ...................... 310/8 |
| 3,832,580 | 8/1974 | Yamamuro et al. .................. 310/9.5 |

FOREIGN PATENTS OR APPLICATIONS

| | | |
|---|---|---|
| 47-37244 | 3/1972 | Japan...................................... 310/8 |
| 1,812,021 | 8/1969 | Germany ............................ 310/8.7 |

*Primary Examiner*—Mark O. Budd
*Attorney, Agent, or Firm*—Haseltine, Lake & Waters

[57] ABSTRACT

A key input device which forms a key switch with high reliability or an integrated keyboard with small dimensions which can produce coded signals with high reliability and a S/N ratio of high value without any encoder circuits, comprising a piezoelectric polymer film, applied as a pressure sensor, having layer electrodes on both surfaces thereof and at least one device for straining the film, the straining device defining a key.

7 Claims, 13 Drawing Figures

POLYMERIC PIEZOELECTRIC KEY ACTUATED DEVICE

The present invention relates to an electrically non-contact key input device which forms a key switch or a keyboard, wherein a piezoelectric polymer film is applied as a pressure sensor or an electro-mechanical transducer.

A key switch has the function of generating voltage pulses, which are triggered by the application of an instant force or instantly enforced strain on the key switch, to control the circuit which starts and stops a function of an electronic apparatus. The key switch has become one of the most important electric devices in man-machine interfaces.

The conventional key switch is a metal contact type. However, such metal contact switches have an inherent problem in that their reliability is detrimentally effected by poor contact at the contact point, chattering and/or bounce. To solve this problem, electrically non-contact switches using a magnetic resistance element or a hall element have been developed. However, these switches require complicated parts and/or controlling circuits.

Recently, development of a non-contact type piezo-electric switch, using piezoelectric ceramics was reported. In this piezoelectric switch, a voltage pulse is generated by imparting an impact on the piezoelectric ceramics. However, as is well known, such piezoelectric ceramics are easily broken when machined because they are brittle. Further, since the piezoelectric ceramics have a constant large stiffness value, sound waves created by impact thereon are reflected repeatedly in the ceramics. This causes the generation of spurious voltage pulses from the piezoelectric ceramics, which lead to errors in the operation of an electronic device controled by a key switch using piezoelectric ceramics. Still further, piezoelectric ceramics require a complicated machining process to produce a shape relevant to a pressure sensor.

An object of the present invention is to provide an electrically non-contact key switch, which avoids the disadvantages of the prior art key switch, with high reliability and a simple arrangement by utilizing a piezoelectric polymeric material as a pressure sensor.

Generally speaking, polymeric material is non-piezoelectric. However, according to recent research reports, a certain kind of optically active polymeric material, such as elongated poly- $\gamma$ -methyl-L-glutamate or the like, and a certain kind of polymeric material which has been poled in a strong D.C.-field, such as poled polyvinylidene fluoride, poled polyacrylonitrile or poled polyvinylchloride, have stable piezoelectricity which changes little with the lapse of time. Further, it is known that a piezo-electric polymeric material, wherein fine particles of ferroelectric inorganic material are distributed, exhibits intensive piezoelectricity after it is poled. The piezoelectric d-constant of such piezoelectric polymeric material has a value of up to about $2 \times 10^{-11}$ C/N, and the piezoelectric g-constant of the material has a value of up to about $10^{-1}$ Vm/N. That is, with respect to a voltage generated with the same input force, the voltage of a piezoelectric polymeric material is higher than that of quartz or piezoelectric ceramics. Therefore, it is noted that a feature of the piezoelectric polymeric material resides in the fact that a large electromotive force is obtained by applying a relatively small input force or strain. This means that when the piezoelectric polymeric material is used as a pressure sensor, it has high sensitivity.

A second feature of the piezoelectric polymeric material resides in the fact that it is not broken by large deformation or strain, since it has high flexibility and impact resistance. Furthermore, the impact energy imparted to the piezoelectric polymeric material to generate a voltage pulse is instantaneously changed into heat to be dissipated, since it has a low mechanical Q factor. In this connection, a desired voltage pulse is generated only when the material receives an impact, and at that time generation of spurious or long lived voltage pulses are effected to such a small extent that they can be neglected. As a result of this there is no generation of chattering.

A third feature of the piezoelectric polymeric material resides in the fact that it can be easily made into a film of the desired dimensions. In the case of the optically active polymer, it is made into a piezoelectric film by elongating it. In the case of the non-optically active polymer, it is made into a piezoelectric film by elongating it and then poling it. This feature is a great advantage in the provision of an integrated keyboard of smalll dimensions and light weight.

In one aspect of the present invention, there is provided an electrically non-contact key switch comprising a piezoelectric polymer film having a layer electrode on each surface thereof and means for straining said film, said means comprising means for stretching the film and a key bar to be forced against the film. In this switch, the polymer film is strained or stressed by the key bar to generate a piezoelectric voltage, charge or current as an output signal of the key switch. The value of the voltage, or charge or current generated by the piezoelectric polymer film is in proportion to the enforced stress or strain of the film. When input impedance of a detecting circuit connected between both surfaces of the piezoelectric film is lower than the output impedance of the film, the height of a pulsed current signal to be detected is also proportional to the strain velocity of the film. Therefore, in order to obtain an output having a predetermined wave form and a predetermined value from the piezoelectric polymer film, it is necessary that the film be subjected to a predetermined strain (or stress) with a predetermined strain velocity.

In the above-mentioned key switch of the present invention, it is difficult to ensure the predetermined strain with the predetermined strain velocity, since such factors vary according to the force applied to the key bar by an operator's finger. In another aspect of the present invention, an electrically non-contact key switch comprises a piezoelectric polymer film having a layer electrode on each surface thereof, and means for straining said film comprising an elastic plate or leaf spring exerting a snap action and means for holding said plate, said film being adhered to said plate to allow said film to be deformed together with said plate. The piezoelectric polymer film adhered on the elastic plate has dynamic characteristics which have not been exhibited by the conventional piezoelectric material or the piezoelectric polymer film alone. The amount of strain or stress of the elastic plate enforced by an input force defines the enforce strain or stress of the piezoelectric film on the elastic plate. Therefore, when the elastic plate is strained by an operator's finger, an output of a piezoelectric pulsed signal having predetermined value and form is generated by the piezoelectric film through the layer electrodes. Since the elastic plate exerts a snap action, just after the input force or the enforced strain reaches a predetermined value, the strain increases considerably instantaneously, and upon removal of the input force the elastic plate returns to its original state. The arrangement comprising the elastic plate and the piezoelectric polymer film thereon is hereinafter referred to as a "complex piezoelectric film". To make the arrangement of the key switch simple, it is desirable that the complex piezoelectric film itself have the snap action characteristic.

A fourth feature of the piezoelectric polymeric material resides in the fact that the material itself is an electrical insulator. Therefore, the piezoelectric polymer film may have a plurality of electrodes on the surface, so that the electrodes send out individual output signals generated from the film.

Further, if an input force is applied vertically to a piezoelectric polymer film under tension, the voltage pulses generated individually through the electrodes have substantially the same amplitudes: the vertical force applied to the film surface is changed into a tension of the film which is parallel to the film surface and is distributed uniformly in the film. In this case, the piezoelectric output signals are related to the piezoelectric d-constant $d_{31}$ and $d_{32}$ for a poled piezoelectric film, and are related to $d_{35}$ for a uniaxially elongated, optically active polymer, where the axes 1, 2 and 3 refer respectively to the film normal, the elongation axis, and the axis orthogonal to these.

In the conventional keyboard of either contact or non-contact type key switches, each key switch on the board generates only one kind of output signal. Therefore, the conventional keyboard requires an encoder circuit to code all of the output signals from the key switches. In such keyboard, an increase in the number of key switches requires very complicated circuitry, which causes an increase in cost. If a coded signal were available from each key switch of the board, a signal processing circuit could be of a very simple arrangement. However, this has not been practiced with the conventional key switches for the reason that they require electric elements having complex characteristics and complicated mechanical parts.

Aother object of the present invention is to provide an integrated keyboard having electrically non-contact key switches, which generate coded output signals individually with high reliability, without any encoder circuit and at low cost.

In another aspect of the present invention, an electrically non-contact key switch comprises a piezoelectric polymer film having coded electrode on the surface thereof and means for straining said film.

In still another aspect of the present invention, an electric non-contact key switch comprises a plurality of piezoelectric polymer films, each having at least one pair of electrodes on the surface thereof, in an arrangement such that said polymer films are piled one on top of the other, with, if necessary, electrical insulators separating said films, to form a unified layer and means for straining said layer.

According to the present invention, a coded signal designating a key is available from a piezoelectric film, when the film is strained by the key bar or the elastic plate exerting a snap action, in the arrangment that a plurality of electrodes are so settled on the film that voltage pulses defining the coded signal are generated through the electrodes. Therefore, if a maximum of $2^n - 1$ keyboard switches are provided, each having a maximum of $n$ coded electrodes on the surface of the piezoelectric film, a maximum of $2^n - 1$ sets of coded voltage pulses are available. Such coded pulses can be easily converted by signal processing circuits to, for example, input signals of transistortransistor logic level (TTL level).

In still another aspect of the present invention, there is provided a keyboard having a plurality of electrically non-contact key switches, each comprising the same piezoelectric polymer film as a pressure sensor and at least a pair of electrodes at a predetermined local area of said polymer film and means for straining said film at said local area. Speaking from another point of view, the abovementioned keyboard is considered a key input device comprising a piezoelectric polymer film having a plurality of local areas, each having at least a pair of electrodes, and a plurality of means for straining said film at said local areas individually, each said straining means defining a key. According to the present invention, said piezoelectric polymer film may exhibit piezoelectricity either over its entire area or only at said local areas. In the latter case, local areas of the film having piezoelectric characteristic are produced by poling the film at the individual areas. Alternatively, the entire piezoelectric polymer film may be locally depolarized to leave the predetermined piezoelectric local areas.

Local areas of the polymer film having piezoelectric characteristics with different polarities can be produced by selectively applying voltages with different polarities to the polymer film at the local areas. Therefore, according to the present invention, there is also provided a key input device using a polymer film having local areas where piezoelectric characteristics with different polarities are exhibited.

The keyboard of the present invention has the advantage that a high signal-noise ratio (S/N) is obtained, which results in the keyboard having a high reliability. Further the keyboard of the present invention can be provided with a large number of key switches in a small arrangement. This would meet a demand such as the provision of a data processing system for Chinese letters which requires a number of keys designating individual letters.

The present invention will hereinafter be described in more detail by way of example with reference to the accompanying drawings in which.

Figure 1:
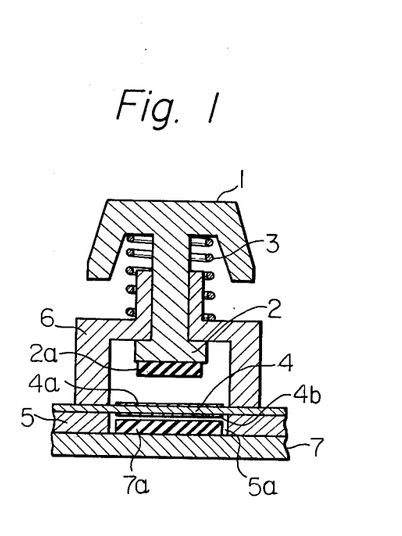
FIG. 1 is a sectional view of an embodiment of an electrically non-contact key switch in accordance with the present invention.

Referring to FIG. 1, an electrically non-contact key switch comprises a piezoelectric polymer film 4 having layer electrodes 4a and 4b on respective surfaces thereof and means for straining the film which comprises a key bar 2 and a board 5. The board 5 has a hole 5a which is covered by the film 4 in a stretched state. The key bar 2, which has a key top 1, is movable against a coil spring 3, by an input force applied to the key top 1, into a housing 6. The housing 6 is mounted on the printing board 5. Numeral 7 denotes a base plate for supporting the printing board 5. A rubber sheet 7a is mounted on the base plate 7 within the hole 5a of the printing board 5, while another rubber sheet 2a is mounted on the bottom of the key bar 2. The piezoelectric polymer film 4 with the electrodes 4a and 4b is obtained in the following manner. A film of biaxially elongated polyvinylidene fluoride with, for example, a thickness of 50 μm and length and width of 15 mm and 15 mm, respectively, is poled for 2 hours by applying a voltage of 2 KV between both surfaces of the film at a temperature of 130°C and then cooled to room temperature, while the electric field is maintained. The piezoelectric polymer film which is thus produced has the following properties.

Piezoelectric d-constant; $d_{31} = 5.8 \times 10^{-12}$ C/N
Piezoelectric g - constant; $g_{31} = 5.7 \times 10^{-2}$ Vm/N A layer electrode is produced on each surface of the film by vaporizing aluminum onto these surfaces.

Figure 2:
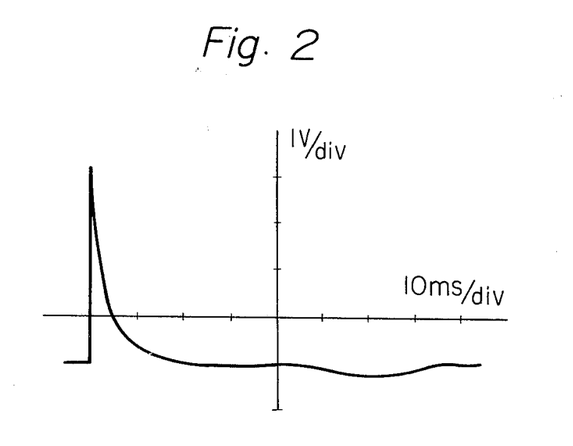
FIG. 2 is a CRT trace curve indicating the output pulse generated between a pair of electrodes upon operation of the key of the key switch shown in FIG. 1.

When an input force is applied to the key top 1, in a conventional manner, by an operator's finger, an output pulse of 2 or 3 V is generated between the electrodes 4a and 4b, as shown in FIG. 2. This pulse may be processed by an amplifier and transformed into the desired electric signal form.

Figure 3:
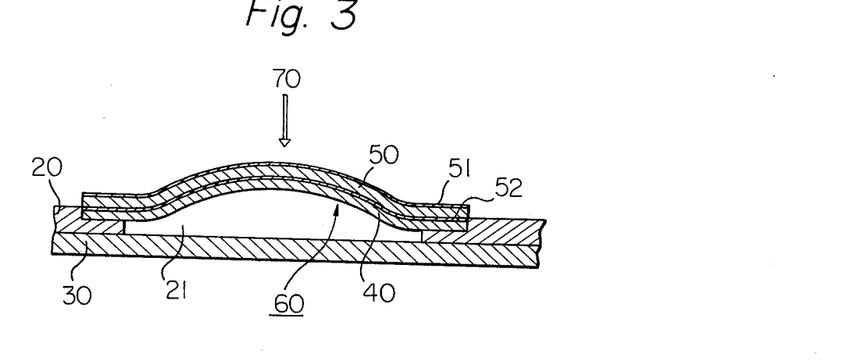
FIG. 3 is a sectional view of another embodiment of a non-contact key switch according to the present invention.

FIG. 3 shows another embodiment of the electrically non-contact key switch of the present invention. In the figure, a thin elastic plate 40, made of a copper-beryllium alloy, forms a convex disk. The thin plate 40 is mounted on a board 20 having a hole 21 so as to cover the hole. The board 20 is supported by a base plate 30. Numeral 50 denotes a piezoelectric film, which corresponds to that of the first embodiment shown in FIG. 1. The piezoelectric film is made, for example, of a biaxially elongated and poled polyvinylidene fluoride. Conductive silver pastes are coated on the respective surfaces of the film 50 to form layer electrodes 51 and 52. The silver coated film is adhered on the upper surface of the thin convex plate 40 with an adhesive, and the combined film 50 and the plate 40 form a complex piezoelectric film 60. The thin plate 40 may be use as an electrode instead of the silver electrode 52, since it is made of metal.

In a case where an input force 70 is applied downwardly to the complex piezoelectric film 60, when the strain of the complex piezoelectric film increases over the predetermined value, the strain instantaneously increases considerably. That is, the convex plate 40, which is held by the board 20, exerts a snap action, when the input force 70 is applied. Concurrently, an output charge of voltage and current in the form of a pulse, which has a predetermined large value, is generated from the piezoelectric film 50 through the pair of electrodes 51 and 52.

Figure 4A:
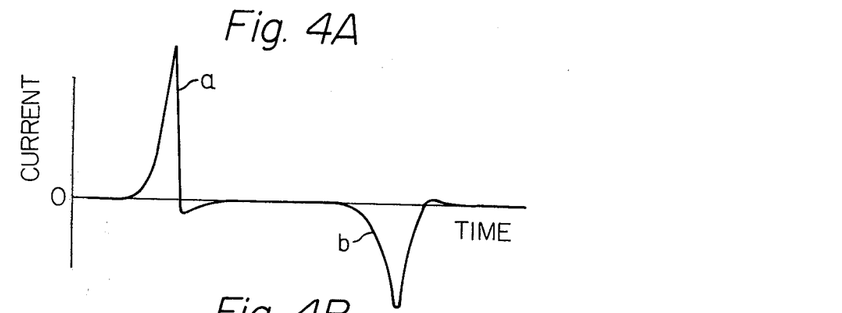
FIGS. 4A and 4B are graphs respectively indicating the current and charge of the output pulse signal generated upon operation of the key of the key switch shown in FIG. 3.
Figure 4B:
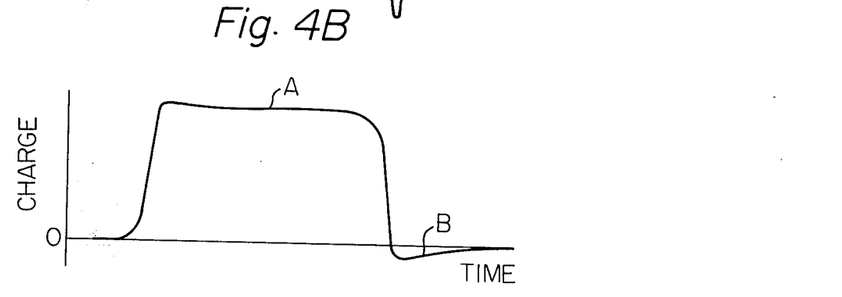

FIGS. 4A and 4B show the current and charge, respectively, of the pulsed output signals generated in the key switch shown in FIG. 3 during a cycle of the key operation. Referring to these figures, pulses a and A having positive polarity are generated, when the input force is applied and the strain of the film increases considerably over the predetermined value. Pulses b and B having negative polarity are generated, when the strain decreases considerably from the maximum value upon removal of the input force.

With respect to the material of the elastic plate having a snap action characteristic, a metal such as a copper-beryllium alloy, phosphor bronze, steel or the like is preferable. Further, a polymeric material such as polystyrene, polycarbonate or the like is also adoptable. A snap action characteristic is exhibited by making such material as, for example, a convex plate.

Figure 5:
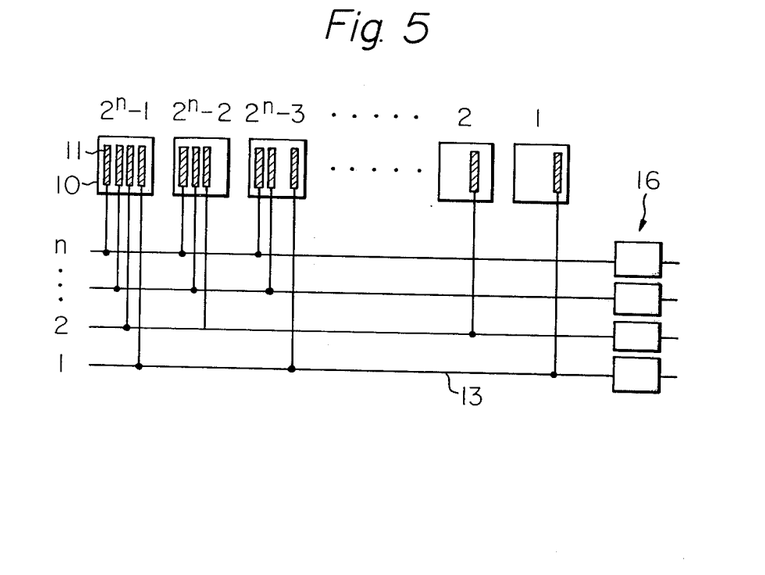
FIG. 5 is a diagram showing a circuit arrangement of an embodiment of an keyboard according to the present invention.
Figure 6A:
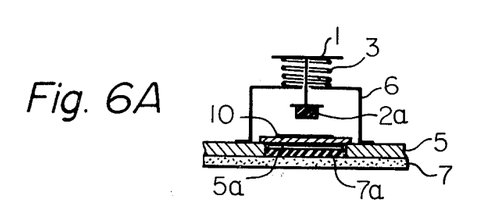
FIG. 6A is a sectional view of a keyboard switch used in the keyboard shown in FIG. 5.
Figure 6B:
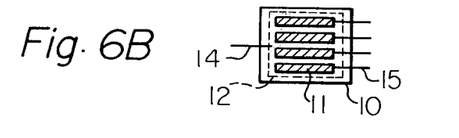
FIG. 6B is a plan view of an area of the piezoelectric polymer film with electrodes shown in FIG. 6A.

An embodiment of a keyboard according to the present invention is shown in FIGS. 5, 6A and 6B. The keyboard has $2^n - 1$ key switches producing coded pulses individually in a circuit arrangement as shown in FIG. 5. Each key switch of the keyboard has a similar arrangement to that of FIG. 1. In FIG. 5, numeral 10 denotes a piezoelectric film used in each key switch. Each film has 1 to n layer electrodes 11 on the upper surface for sending out the generated output pulses. These electrodes are referred to as output electrodes hereinafter. Each film has a layer electrode on the lower surface, which is grounded through a lead 14. This electrode will be referred to as a grounded electrode hereinafter. In the film, each output electrode and the grounded electrode electrically form a pair of electrodes through which an output pulse is generated from the film. Each output electrode is connected to one of n sequences of circuits 13 through a lead 15. FIG. 6A shows an arrangement of the key switch. In the figure, the same numerals as used in FIG. 1 denote elements or members which correspond to those of FIG. 1. FIG. 6B shows an electrode arrangement in one of the keyboard switches. According to the keyboard shown in FIGS. 5, 6A and 6B, $2^n - 1$ set of coded voltage pulses are generated by individual key operations of the keyboard switches through the n sequences of circuits 13. Each set of coded pulses are converted to, for example, input signals of TTL level by signal processing circuits 16 which include amplifiers.

The piezoelectric polymer film 10 with the electrodes 11 and 12 is obtained in the following manner. A film of biaxially elongated polyvinylidene fluoride, for example, of a thickness of 50 μm is poled with an electric DC field of 2 KV for 2 hours at a temperature of 130°C. the resultant film has piezoelectric constants of $d_{31} = 6.0 \times 10^{-12}$ C/N and $g_{31} = 5.8 \times 10^{-2}$ Vm/N. From the resultant film, a piezoelectric film 10 withh length and width of 16 mm and 15 mm, respectively, is obtained.

The output electrodes 11, each with length and width of 10 mm and 2 mm, respectively, are formed separately on one surface of the film by conductive silver pastes, while over the entire other surface the grounded electrode 12 is formed by a conductive silver paste. Each output electrode 11 and the grounded electrode 12 are connected through a condenser of 500 PF. When each keyboard switch is operated with ordinary force by a finger, about a 2 V peak pulse with a time duration of about 5 m sec is generated from the piezoelectric film 10 through each output electrode 11. In such keyboard switches as shown in FIG. 5, the electrodes of each key switch serve as parallel condensers. Therefore, the value of the voltage pulse generated through each output electrode decreases when the number of the key switches increases. However, in this example, even if the number of key switches increases up to about 200, output signals, which can be easily amplified without decreasing the S/N ratio, can be obtained from the piezoelectric film of each switch.

Figure 8:
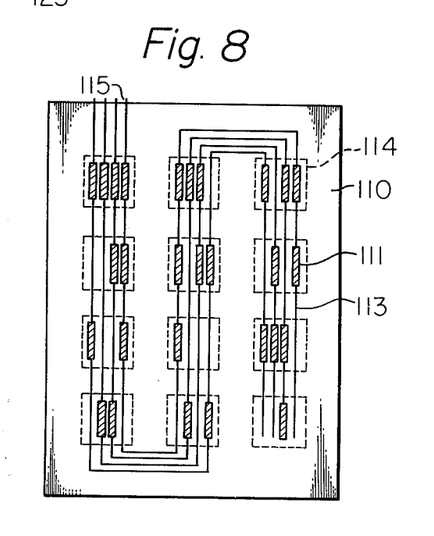
FIG. 8 is a plan view of an embodiment of the piezoelectric polymer film with the electrodes and conductive circuits used in the keyboard shown in FIG. 7.

FIG. 8 shows an embodiment of a piezoelectric polymer film arrangement used in a keyboard of the present invention, which has 12 keyboard switches, each generating 4-bit output signals. In the figure, a sheet of polymer film 110 has separated areas 111 (shown as shaded portions) only where piezoelectric characteristics are exhibted individually. These piezoelectric areas are formed by locally poling a polymer film, which has a characteristic such that it is changed into a piezoelectric film by poling. Which areas or portions of the film should be poled locally to exhibit piezoelectric characteristics is determined according to the necessary code arrangement. On one surface of the film at each poled area 111, a layer electrode is formed as an output electrode by a conventional metal evaporating process or printing process. A conductive layer as a grounded electrode is formed over the entire other surface of the film by the same process as the output electrodes above. The grounded electrode and each output electrode form a pair of electrodes. Each block 114 (area enclosed by a broken line) covers a set of the coded output electrodes and defines a location of a key switch. Each set of the coded electrodes is connected to four sequences of conductive circuits 113. When the film 110 at each block 114 is pushed by a key, a voltage is generated from the film part within the block and, thus, 4-bit coded signals appear from the output ends 115 of the circuits 113.

Figure 7:
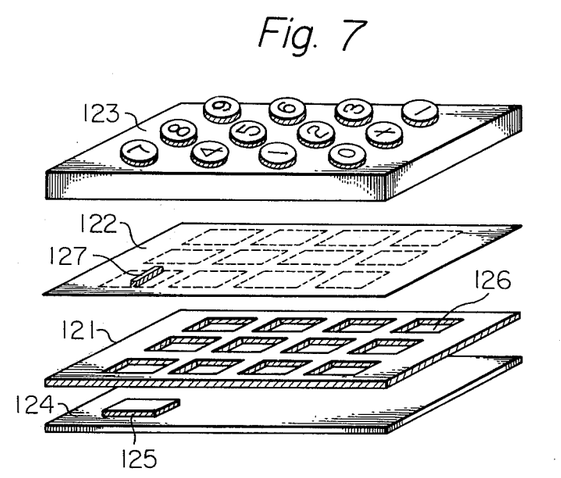
FIG. 7 is an exploded perspective view of an embodiment of a keyboard according to the present invention.

FIG. 7 shows an embodiment of the keyboard arrangement wherein the piezoelectric polymer film shown in FIG. 8 is applied. Referring to FIG. 7, a piezoelectric polymer film arrangement 122 (which corresponds to the film arrangement shown in FIG. 8) is attached in a stretched state on a perforated plate 121. The perforated plate has holes 126 corresponding to the blocks of the film. A key assembly 123 forms a plurality of means for straining the film at the blocks individually. The key assembly has a plate where key tops with key bars which correspond to the blocks of the film are arranged, and it is mounted on the film attached to the perforated plate. Numeral 124 denotes a shield plate to effect a complete shield of the output electrodes. In order to receive the film at the blocks when the film is strained, rubber sheets 125 may be mounted on the shield plate 124 at the areas corresponding to the block of the film or the hole 126 of the perforated plate. Preferably a bar 127 is mounted on the film at each block so that an equally distributed uniform pressure will be exerted on the surface of the film within the block. To make the figure simple, only one bar and one rubber sheet are shown.

It will be obvious from the above description that a system for pushing the film directly with a finger, instead of the key arrangement, can also be utilized. In this case, it is preferable to adopt a perforated plate having holes corresponding to the blocks of the film instead of the key assembly.

Figure 9:
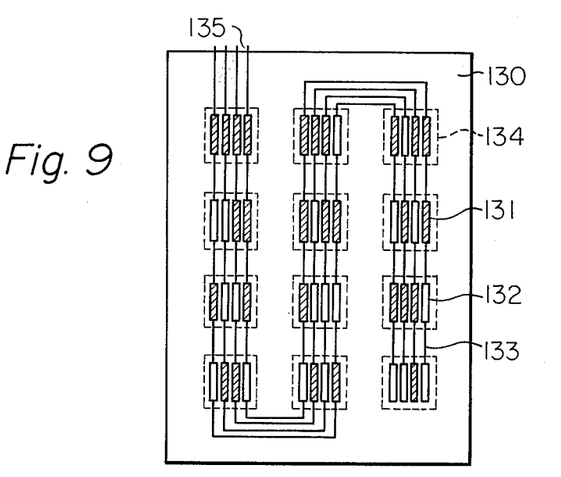
FIG. 9 is a plan view of another embodiment of the piezoelectric polymer film with the electrodes and conductive circuits used in the keyboard shown in FIG. 7.

FIG. 9 shows another embodiment of a piezoelectric polymer film arrangement used in a keyboard of the present invention, which has 12 key switches, each generating 4-bit output signals. In the figure, a sheet of polymer film 130 has blocks 134. Within each block, there are provided areas 131 and 132 where piezoelectric characteristics with different polarities are exhibited. The areas 131 (shaded portions), having piezoelectric characteristics with negative polarities, are provided by locally poling the film at the areas with a DC voltage of positive polarity, while the areas 132 (blank portions), having piezoelectric characteristics with positive polarities, are provided by locally poling the film at the areas with a DC voltage of negative polarity. When the film at a block is strained by operation of a key, the film at each shaded portion 131 generates a voltage with a positive polarity, while the film at each blank portion 132 generates a voltage with a negative polarity. Output electrodes are formed on the surface of the film at the areas 131 and 132. A grounded electrode is formed over the entire other surface of the film. The output electrodes are connected to four sequences of circuits 133 as shown in FIG. 9. Therefore, 4-bit coded signals consisting of pulses with different polarities appear from the output end 135 of the circuits 133. Since the coded signals are complementary with regard to parity check, the appearance of incorrect signals is easily detected. As a result this keyboard has high reliability.

If, in addition to the areas of the film having the piezoelectric characteristics with different polarities, non-piezoelectric area or areas are included within the block, just like those shown in FIG. 8, it is possible to produce coded output signals consisting of pulses having positive, negative and zero values. Therefore, if n sequences of circuits are employed in a keyboard, distinguishable output signals can be produced from a maximum of $3^n - 1$ key switches. This means that many different output signals can be produced with relatively few sequences of circuits.

Figure 10:
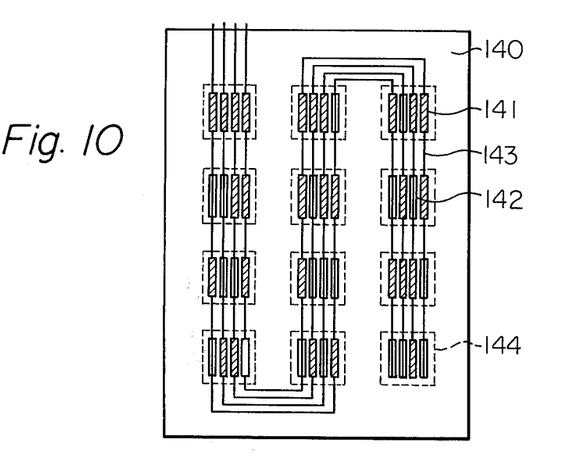
FIG. 10 is a plan view of another embodiment of the piezoelectric polymer film with the electrodes and conductive circuits used in the keyboard shown in FIG. 7.

In the embodiments shown in FIGS. 8 and 9, the piezoelectric polymer films are obtained by locally poling polymer films. Such locally poling process is relatively throblesome to perform. FIG. 10 shows another embodiment of piezoelectric polymer film arrangement used in a keyboard of the present invention, wherein a sheet of polymer film having a piezoelectric characteristic over the entire surface is employed as a pressure sensor for each key switch. In this case, a simple poling process is applicable. Referring to FIG. 10, numeral 140 denotes a sheet of polymer film which exhibits a piezoelectric characteristic over its entire surface. The film 140 is made of, for example, a polymer film which has been poled over the entire area of an elongated film of polyvinylidene fluoride. A film of poly-$\gamma$-methyl-L-glutamate, which exhibits a piezoelectric characteristic after elongation may also the used for the film 140. On the upper surface of the film 140 output electrodes 141 are formed within blocks 144 to produce 4-bit coded signals from a key switch. These electrodes are connected to four sequences of circuits 143. On the lower surface of the film 140, a grounded electrode is coated within each block 144 except for the region or regions 142 (blank portions in the figure). When the film 140 at the block 144 is pushed with a key, an output signal appears from each circuit sequence which runs over the grounded electrode within the block. However, no outut signal appears from any circuit sequence which does not run over the grounded electrode within the block, in other words, which runs through a blanked portion 142 within the block.

The same coded signals as those from the electrode arrangement of the piezoelectric film mentioned above can be obtained by locally depolarizing the piezoelectric film to leave the necessary piezoelectric areas. When the piezoelectric film at the area corresponding to the blanked portion 142 is heated locally with a heated metal plate or infrared ray, the film at that area becomes non-piezoelectric. Such depolarizing process is applicable only to a polymer film which can be poled to be piezoelectric. In this case, since a grounded electrode is allowed to occupy the block, the S/N ratio of the output signal becomes larger than that in the piezoelectric polymer film arrangement shown in FIG. 8.

The piezoelectric polymer film arrangments shown in FIGS. 9 and 10 are also employed with the keyboard shown in FIG. 7 in the same manner as the film arrangement 122.

Coded signals can be obtained by such piezoelectric polymer film arrangements as mentioned before. However, it is noted that in the coded electrode arrangement on the piezoelectric polymer film wherein sets of the coded electrodes are provided, each set defining a key, an increase in the number of the sets leads to a decrease in the area occupied by each set and an increase in the capacity of the condensers parallel to the electrodes on the film. This causes the output voltage to have a decreased value.

Figure 11:
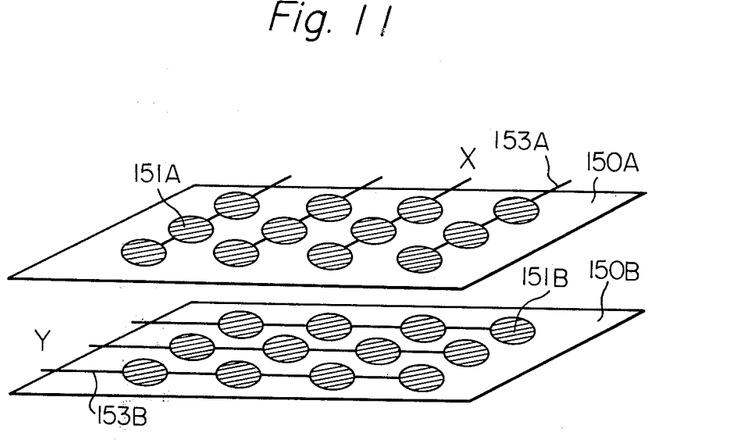
FIG. 11 is an exploded perspective view of an embodiment of stacked piezoelectric polymer films with the electrodes and conductive circuits used in the keyboard shown in FIG. 7.

FIG. 11 shows an embodiment of a piezoelectric polymer film arrangement used in a keyboard of the present invention, which arrangement avoids the above-mentioned disadvantage. Referring to FIG. 11, two sheets of polymer film 150A and 150B are piezoelectric over their entire surface or are locally piezoelectric at corresponding areas 151A and 151B (shaded portions), respectively. On one surface of each of the films 150A and 150B, output electrodes are formed at the areas 151A and 151B. The output electrodes are connected to conductive circuits 153A and 153B as shown in FIg. 11. Earthed electrodes are formed all over the other surface of each of the films, respectively. The films 150A and 150B are piled one on top of the other with an electric insulator film (not shown) separating the films to form a unified layer. The conductive circuits 153A on the film 150A and the conductive circuits 153B on the film 150B are in an orthogonal relationship to each other. The unified layer is also employed in the keyboard shown in FIG. 7 in the same manner as the film arrangement 122.

When the unified layer at the area 151A corresponding to the area 151B is pushed by a key, output signals appear at the output ends X and Y of the circuits 153A and 153B, respectively. The produced signals are amplified and coded through an encoder circuit.

The areas 151A and 151B may have the same coded electrodes, respectively, as those of the film arrangement shown in FIG., 8, FIG. 9 or FIG. 10. Further, a unified layer consisting of more than two sheets of the film such as shown in FIGS. 8 through 10 can be employed in the keyboard.

With the film arrangements as shown in FIG. 8, FIG. 9 or FIG. 10, a maximum of about eight sequences of circuits could be provided to produce 8-bits signals. If a plurality of such film arrangements were stacked to form a unified layer, the number of circuits which could be operated by a key increases proportionally to the number of stacked films. Therefore it is believed that such unified layer is especially useful in construction of an integrated keyboard.

With respect to such complex film as shown in FIG. 3, a complex film having a large area can be easily provided. Therefore, there can be provided a complex film comprising an elastic plate having a plurality of areas where snap actions would be exerted individually and a sheet of a piezoelectric polymer film which is adhered thereon, each of said areas with a part of the polymer film defining a key. A keyboard wherein the above-mentioned complex film is employed can be provided.

Further in the above-mentioned complex film, each area of the polymer film is allowed to have coded electrodes. Therefore, there can be provided a keyboard, producing coded signals from each key without any encoder circuits, in such keyboard circuits as shown in FIGS., 5, 8, 9 or 10. Of course, a keyboard having a plurality of key switches having individual complex films as shown in FIG. 3 can also be provided.

Still further, a key switch having a complex film comprising an elastic plate having a piezoelectric polymer film adhered on each surface thereof or a keyboard having such key switches can be provided. Further there can be provided a keyboard having a complex film comprising an elastic plate having a plurality of areas where snap action is exerted individually and two piezoelectric polymer films adhered on respective surfaces of the plate, each area of the plate defining a key.

As to the polymeric materials in a film form used in the key switch or keyboard of the present invention either: (I) polymer or copolymer of vinylidene fluoride, polymer or copolymer of polyvinyl fluoride, polymer or copolymer of acrylonitrile, polyvinyl chloride, polyvinylidene chloride or polyundecaneamide (nylon 11) may be adopted, or; (II) poly- $\gamma$ -benzyle-L (or D)-glutamate or poly- $\gamma$ -methyl-L (or D)-glutamate may be adopted. The former materials (I) are poled to be piezoelectric, while the latter materials (II) are uniaxially elongated to be piezoelectric. It is desirable to elongate the former materials (I) uniaxially or biaxially in order to change them into piezoelectric materials having a large value. However, if a film of the polymeric materials (I) or the like, wherein powders of ferroelectric materials such as $PbZr_xTi_{1-x}O_3$(PZT) or $BaTiO_3$ are dispersed is poled to be piezoelectric, a preferable piezoelectric film may be obtained. A piezoelectric polymer film having larger values of piezoelectric d- and g- constants is the more desirable. In a practical use, the following values of the constants are preferable.

$$d > 10^{-12} \text{ C/N}$$

and $$g > 10^{-2} \text{ Vm/N}$$

With respect to a preferable thickness of the piezoelectric polymer film, it ranges in value from 20 to 1000 $\mu$m.

The invention has been described in detail with particular reference to preferred embodiments thereof, but it will be understood that variations and modifications can be effected within the spirit and scope of the invention.

What we claim is:

1. A electrically non-contact key input device comprising a piezoelectric polymer film having layer electrodes on both surfaces thereof, and means for straining said film so that said film is extended or contracted along the surface of said film, said straining means defining a key, said straining means comprising a snap action elastic plate with an upwardly convex surface, said film being adhered to said plate in such a manner that said film is contracted along the surface thereof together with said snap action plate upon downward depression.

2. An electrically non-contact key input device according to claim 1, further comprising a key bar with a key top, said key bar being arranged so that it can be forced vertically against said elastic plate.

3. An electrically non-contact key input device according to claim 1, comprising a plurality of holding means for said plate, said elastic plate having areas where snap actions are exerted individually, said holding means being applied to said polymer film at said areas-thereof individually, said holding means and said corresponding areas of said plate defining individual keys, each area of said film having at least one pair of said electrodes.

4. An electrically non-contact key input device according to claim 3, comprising two sheets of said piezoelectric film, which are stuck on respective surfaces of said plate.

5. An electrically non-contact key input device according to claim 1, wherein said piezoelectric polymer film is made of polymeric material selected from the group consisting of polyvinylidene fluoride, polyvinyl fluoride, polyacrylonitrile, polyvinyl chloride, polyvinylidene chloride, poly- $\gamma$ -benzyl-L (or D)-glutamate, poly- $\gamma$ -methyl-L (or D)-glutamate, and nylon 11.

6. An electrically non-contact key input device according to claim 1, wherein said piezoelectric film has a piezoelectric d-constant having a value more than $10^{-12}$ C/N, and a piezoelectric g-constant having a value more than $10^{-2}$ Vm/N.

7. An electrically non-contact key input device according to claim 1, wherein said piezoelectric polymer film has a thickness of 20 to 1000 $\mu$m.

* * * * *